(12) United States Patent
Sun (10) Patent No.: US 6,482,264 B1
(45) Date of Patent: Nov. 19, 2002

(54) SYSTEMS AND METHODS FOR FABRICATION OF COATING LIBRARIES

(75) Inventor: Xiao-Dong Sun, Schenectady, NY (US)

(73) Assignee: General Electric Company, Niskayuna, NY (US)

(*) Notice: Subject to any disclaimer, the term of this patent is extended or adjusted under 35 U.S.C. 154(b) by 7 days.

(21) Appl. No.: 09/696,592

(22) Filed: Oct. 26, 2000

(51) Int. Cl.[7] .............................. B05C 5/00; B05C 11/00

(52) U.S. Cl. ......................... 118/58; 118/688; 118/300

(58) Field of Search ................................. 118/663, 688, 118/689, 690, 58, 504, 720, 721, 300; 204/298.11, 298.13

(56) References Cited

U.S. PATENT DOCUMENTS

| | | | |
|---|---|---|---|
| 4,862,827 A | * 9/1989 | Getson | 118/58 |
| 4,968,535 A | 11/1990 | Terai et al. | 427/358 |
| 5,075,139 A | 12/1991 | Crumbach et al. | 427/286 |
| 5,215,253 A | * 6/1993 | Saidman et al. | 118/300 |
| 5,985,356 A | 11/1999 | Schultz et al. | 427/8 |
| 6,004,617 A | 12/1999 | Schultz et al. | 427/8 |
| 6,034,775 A | 3/2000 | McFarland et al. | 356/364 |
| 6,045,671 A | 4/2000 | Wu et al. | 204/298.11 |

FOREIGN PATENT DOCUMENTS

| | | |
|---|---|---|
| DE | 19852079 | 5/2000 |
| WO | 9841316 | 9/1998 |
| WO | 9847613 | 10/1998 |
| WO | 0006306 | 2/2000 |

OTHER PUBLICATIONS

Patent Abstracts of Japan, vol. 2000, No. 09, Oct. 13, 2000 & JP 2000 153184A (Toyota Motor Corp., Jun. 6, 2000.

Lewis J. Rothberg and Andrew J. Lovinger, "Status of and Prospects for Organic Electroluminescence," *Journal of Materials Research*, vol. II, No. 12, pp. 3174–3187, Dec. 1996.

X.D. Xiang, Xiaodong Sun, Gabriel Briceno, Yulin Lou, Kai–An Wang, Hauyee Chang, William G. Wallace–Freedman, Sung–Wei Chen, Peter G. Schultz; "A Combinatorial Approach to Materials Discovery," *Science*, vol. 268, Jun. 23, 1995.

J.J. Hanak; *Journal of Materials Science* 5 (1970) 964–971; "The 'Multiple–Sample Concept' in Materials Research: Synthesis, Compositional Analysis and Testing of Entire Multicomponent Systems".

R.B. van Dover, L.F. Schneemeyer, R.M. Fleming; *Nature*, vol. 392, Mar. 12, 1998; "Discovery of a useful thin–film dielectric using a composition–spread approach".

* cited by examiner

Primary Examiner—Richard Crispino
Assistant Examiner—Yewebdar T. T.
(74) Attorney, Agent, or Firm—Noreen C. Johnson; Christian G. Cabou

(57) ABSTRACT

Systems and methods for high throughput fabrication and analysis of an array of coated materials. The systems include a movable substrate having a plurality of predefined regions, where a plurality of materials are provided for coating the substrate. A delivery mechanism associated with the plurality of materials delivers a continuously varying mixture of the plurality of materials onto the surface of the substrate. The methods include delivering a continuously varying mixture of a plurality of materials onto the surface of a movable substrate having a plurality of predefined regions to form a predefined coating on each of the regions.

24 Claims, 7 Drawing Sheets

«SYSTEMS AND METHODS FOR FABRICATION OF COATING LIBRARIES»

BACKGROUND OF THE INVENTION

This disclosure relates generally to systems and methods for generating and screening coating libraries, and more particularly, to systems and methods for the deposition of layers of materials onto a substrate to form a coating library.

Coatings are widely used in industry to enhance the functionality and add-on value of bulk materials. There are generally two types of functional coating materials: inorganic and organic coatings. Organic coatings are widely used in many industrial protective/decorative applications, such as automobile top clear coatings, paints, etc. Other types of organic coatings include, for example, protective and anticorrosive coatings, adhesive and release coatings, environmental barrier coatings, electric conductive/optic transparent coatings, scratch resistant hard coatings, etc. Discovery of an advanced coating formula promises huge value for a manufacturer.

The development of generic tools to accelerate the discovery process for various coating systems may be of even higher value, however, as the search for and optimization of advanced coatings is more of an art than a science. The power of theoretical guidance in the search for and optimization of advanced coatings is limited, largely because of the complexity of a typical coating system and the multiplicity of quality requirements that must be met. Typically, industrial coating formulations have to meet multiple functional requirements, and multiple compatible functional groups or blends are necessary to obtain a balanced formulation. In addition, the properties of a coating system depend not only on the formula/composition, but also on the processing conditions and the coating application method. For example, the degree of thickness uniformity and surface roughness, which depend on the processing and application method of a coating, are important in the quality and reproducibility of the coating. Further, different processing conditions, including exposure to ultraviolet (UV)/electron curing, varying temperature/pressure, and the sequence of application of each layer of multiple layer coatings, are highly important factors in determining the structure/composition of the final coating. Additionally, the structure/composition of the final coating impacts the functionality of the coating. Thus, because of the multitude of variables, most of the usable industrial coating systems developed to date have been the result of serendipitous trial-and-error experimental processes.

BRIEF SUMMARY OF THE INVENTION

Therefore, there is a need for an approach that accelerates the rate at which functional coatings are generated and studied for various manufacturing applications. Thus, the present invention provides systems and methods for high throughput fabrication and analysis of an array of coated materials.

A system of one embodiment for making an array of coated materials that form a coating library includes a substrate having a surface with a plurality of predefined regions, where a plurality of materials are provided for coating the substrate. A delivery mechanism associated with the plurality of materials is positioned to deliver a continuously varying mixture of the plurality of materials onto the surface of the substrate.

A method of one embodiment for making an array of coated materials that form a coating library includes delivering a continuously varying mixture of a plurality of materials onto the surface of a substrate having a plurality of predefined regions to form a predefined coating on each of the regions.

DETAILED DESCRIPTION OF THE INVENTION

Figure 1:
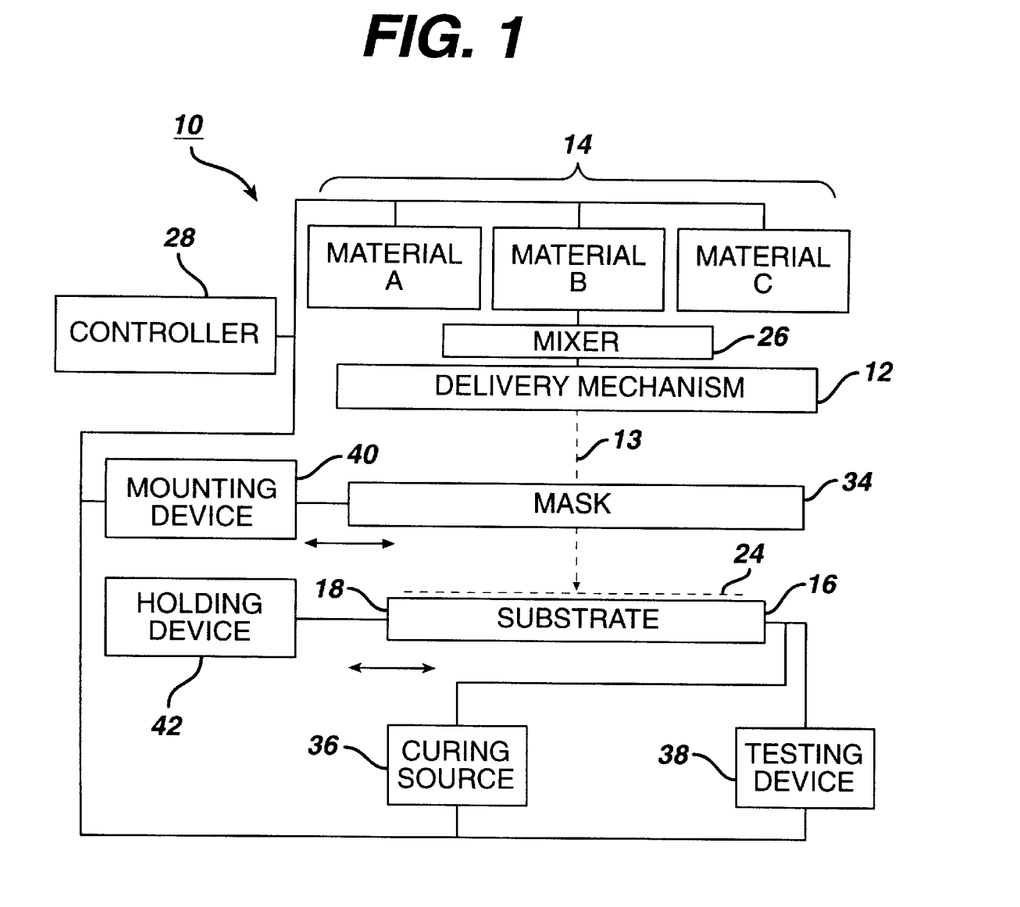
FIG. 1 is a schematic diagram of a system for making an array of coated materials that form a coating library.
Figure 2:
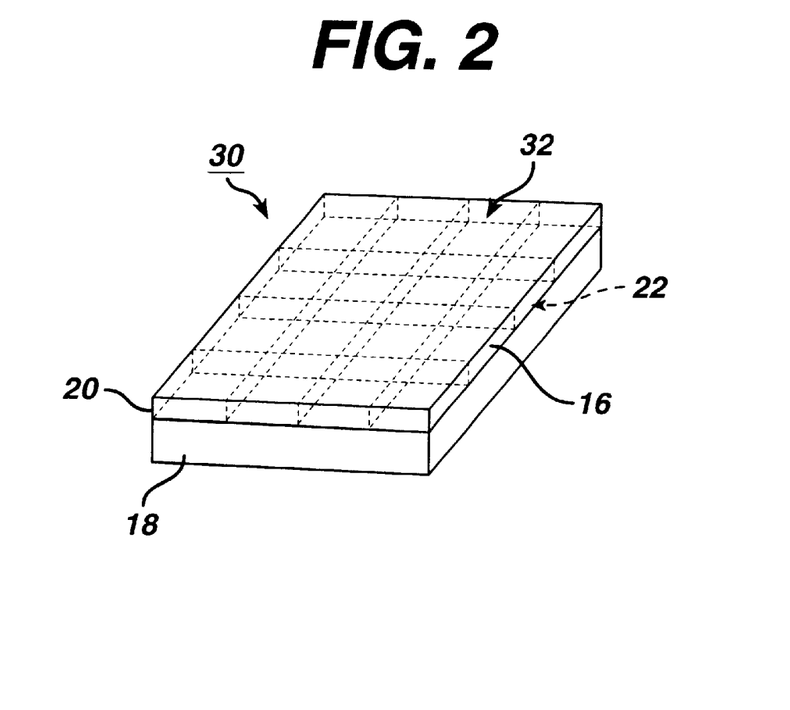
FIG. 2 is a schematic diagram of a coating library formed from the system of FIG. 1.

Referring to FIGS. 1 and 2, a system 10 for making an array of coated materials that form a coating library includes a delivery mechanism 12 delivering a continuously varying mixture 13 of a plurality of materials 14 onto a surface 16 of a substrate 18 to form a coating 20. The substrate surface 16 has a plurality of predefined regions 22 that are positioned within a delivery area 24. The delivery mechanism 12 is positioned to deliver the continuously varying mixture 13 of the plurality of materials 14 to the delivery area 24. A mixer 26 combines the plurality of materials 14 to form a mixture or combination 13 of the plurality of materials 14, with a controller 28 controlling the selection, quantity, and sequence of delivery of each of the plurality of materials 14 to the mixer 26 such that the composition of the coating 20 may be varied, either incrementally or continuously, between each of the plurality of predefined regions 22 on the substrate surface 16 to form a coating library 30. As such, each of the plurality of predefined regions 22 is coated with one of a plurality of predefined coatings 32. The plurality of predefined coatings 32 include: a single layer coating of one of the plurality of materials 14 and a single layer coating of a combination 13 of the plurality of materials 14. Optionally, the plurality of predefined coatings 32 may also include: a multiple layer coating, where each layer is one of the plurality of materials 14, and a multiple layer coating, where each layer is a combination 13 of the plurality of materials 14. Additionally, the system 10 may include a mask 34 in communication with the controller 28 to permit delivery of the continuously varying mixture 13 of the plurality of materials 14 to different combinations of the plurality of predefined regions 22. The system 10 may also include a curing source 36 for curing the plurality of materials 14, either as they are being delivered onto the substrate 18 or once they have been deposited on the substrate 18. Further, the system 10 may include a testing device 38 to perform analytical tests on the coated substrate 18 or coating library 30, to determine the properties of each of the plurality of predefined coatings 32. The mask 34 may be secured by a mounting device 40, which optionally may movably position the mask 34 within the system 10. Similarly, the substrate 18 may be secured by a holding device 42, which preferably movably positions the substrate 18 within the system 10. Thus, the present invention provides a system 10 and method for manufacturing and testing a coating library 30 having an array of coatings 20 established from a continuously varying mixture 13 of a plurality of materials 14 delivered onto a substrate 18.

The delivery mechanism 12 may be a single device or it may be a plurality of individual devices, each delivering the continuously varying mixture 13 of the plurality of materials 14 onto the substrate 18. The position of the delivery mechanism 12 is preferably fixed within the system 10 relative to the delivery area 24. Preferably, the delivery mechanism 12 projects the continuously varying mixture 13 of the plurality of materials 14 to the delivery area 24 in a vaporized/atomized form or in a liquid form. Suitable examples of a delivery mechanism 12 include: a spray nozzle or gun of any type, such as an air, airless, thermal, ultrasonic, or hydraulic force spray nozzle or gun; an ink jet print head; and a coating head.

The plurality of materials 14 include organic materials in various states, such as liquid and vaporized/atomized materials. Suitable examples of organic coatings include polymeric materials, oligomeric materials, and small molecules, where small molecules are individual monomers that react to form a coating. The polymeric materials include, but are not limited to, polycarbonates, acrylics, silicones, cellulose esters, polyesters, alkyds, polyurethanes, vinyl polymers, and the like. Preferably, the plurality of organic materials include organic polymeric materials, such as "architectural" materials derived from organic materials having protective or decorative functionality, especially including thermoplastic or thermosetting polymers. Further, the plurality of materials 14 preferably can be vaporized or atomized, individually or in combination, and directed to or deposited onto a substrate 18, where the vaporized/atomized material coalesces and forms a continuous coating 20 if a sufficient amount of the material 14 is delivered onto the substrate 18. Alternatively, the plurality of materials 14 can be directed to or deposited onto the substrate 18 in liquid form. Optionally, the material 14 or combination 13 of materials 14 may form a coating 20 having a plurality of layers, where the coating 20 may be a multi-functional coating 20 having an overall function dictated by a predefined functional role of each layer. The materials 14 may be combined such that multiple organic materials are combined into a coating 20. By providing these various combinations 13 of materials 14, the interaction and compatibility of various combinations 13 of materials 14 may be determined through the use of a testing device 38.

The coating 20 is a material 14 or a combination 13 of materials 14 deposited on the substrate 18. These materials 14 may remain as separate homogenous materials, or they may interact, react, diffuse, mix, or otherwise combine to form a new homogeneous material, a mixture, a composite, or a blend. In general, a coating 20 has a lateral measure, i.e. a measured length across the surface 16 of the substrate 18, much greater than a thickness, i.e. a measure of the coating 20 normal to the surface 16 of the substrate 18. Preferably, each layer of coating 20 is a thin film layer. The coating 20 may vary in composition, preferably in an incremental or continuous manner, from one predefined region 22 to another to thereby form an array of coatings that define the plurality of predefined coatings 32 of the coating library 30. Each of the array of coatings are distinguishable from each other based on their location. Further, each of the array of coatings may be processed under the same conditions and analyzed to determine their performance relative to functional or useful properties, and then compared with each other to determine their relative utility. Alternatively, each of the array of coatings may be processed under different conditions and the processing methods may be analyzed to determine their performance relative to functional or useful properties, and then compared with each other to determine their relative utility.

Each of the plurality of predefined regions 22 is a fixed area on the substrate 18 for receiving one or a combination 13 of the plurality of materials 14 to form a coating 20. Each of the predefined regions 22 may have any shape sufficient for receiving and analyzing the coating 20 deposited thereon, such as rectangular, linear, arcuate, circular, elliptical, combinations thereof, etc. Each predefined region 22 typically has an area in the range of about 0.01 $mm^2$ to about 100 $cm^2$, preferably in the range of about 1 $mm^2$ to about 1 $cm^2$, and more preferably in the range of about 10 $mm^2$ to about 50 $mm^2$. Other areas may be utilized, and the area of each predefined region 22 may be determined by the capability of deposition and analytical devices and by a preferred density of the coating library 30.

The substrate 18 is a rigid or semi-rigid material suitable for receiving and supporting the continuously varying mixture 13 of the plurality of materials 14. The substrate 18 has at least one substantially flat surface 16 that includes the plurality of predefined regions 22. This substantially flat surface 16, however, may have raised portions to physically separate each of the plurality of predefined regions 22. The substrate 18 may be of any size and shape, but preferably is in an elongated shape, such as in a tape or roll. The substrate 18 may also be in a disk or plate shape. The substantially flat surface 16 of the substrate 18, corresponding to the delivery area 24, typically has an area in the range of about 1 $mm^2$ to about 1 $m^2$, preferably in the range of about 50 $mm^2$ to about 750 $cm^2$, and more preferably in the range of about 1 $cm^2$ to about 500 $cm^2$.

The substrate 18 may be secured within the system 10 and positioned in the delivery area 24 by the holding device 42. The holding device 42 may movably position the substrate 18. Preferably, the holding device 42 may movably position the substrate 18 at a substantially constant rate. For example, for a substrate 18 in the form of an elongated tape or roll, the holding device 42 may include a tape pay-out device and a tape take-up device that are both rotatable and that support the tape, possibly in combination with rollers, in the delivery area 24. In another example, the holding device 42 may be a stage on which the substrate 18 is placed and secured, where the stage is connected to a motor or other actuator-type device that controls the position of the stage relative to the delivery area 24. As such, the controller 28 may control the movement of the holding device 42 to determine the predefined regions 22 onto which the materials 14 are delivered. For example, the controller 28 may move the holding device 42 such that predefined ones of the plurality of predefined regions 22 are outside of the delivery area 24 and therefore do not receive the continuously varying mixture 13 of the plurality of materials 14.

The delivery area 24 is an area at a fixed position within the system 10. The delivery area 24 may be of any shape or size and typically, but not necessarily, substantially corresponds in shape and size to the plurality of predefined regions 22 on the surface 16 of the substrate 18. However, the plurality of predefined regions 22 on the surface 16 of the substrate 18 may be much larger or much smaller than the delivery area 24. The fixed positioning of the delivery area 24 provides a known, constant locale for the system 10 to deliver the plurality of materials 14 onto the surface 16 of the substrate 18.

The mixer 26 is a device for mixing, blending, or otherwise combining the plurality of materials 14 to form the mixture 13 that is delivered to the substrate 18. The mixer 26 may comprise, for example, a mechanical mixer/stirrer, a magnetic mixer/stirrer, and an ultrasonic mixer/stirrer, suitable for mixing viscous materials including, for example, silicone, epoxy resins, polyurethane, and polyacrylate. The mixer 26 may optionally include a device for delivering the continuously varying mixture 13 of the plurality of materials 14 to the delivery mechanism 12, or it may be operatively connected to a separate liquid feeding pump for this purpose. The mixer 26 may also comprise an integrated, in-line, passive device, suitable for mixing materials of low viscosity.

The controller 28 is a computer system having inputs, outputs, a memory, and a processor for receiving, sending, storing, and processing signals and data to operate, monitor, record, and otherwise functionally control the operation of the system 10. The controller 28 includes a computer system having an interface board for integrating all of the components of the system 10 and a motion controller for controlling the movements of the mask 34 and substrate 18. The controller 28 may include a keyboard for inputting data and commands, a video display for displaying information, and a printer for printing information. The controller 28 may include software, hardware, firmware, and other similar components and circuitry for operating the system 10. The controller 28 may be a single device, or it may be a plurality of devices working in concert. The controller 28 is preferably in communication with all of the other components of the system 10, including the plurality of materials 14, the mixer 26, the delivery mechanism 12, the substrate 18, the mask 34, the curing source 36, the testing device 38, the mounting device 40, and the holding device 42, to coordinate the operations of the system 10. For example, the controller 28 controls the selection, quantity, and sequence of delivery of each of the plurality of materials 14 to the mixer 26 such that the composition of the coating 20 may be varied, either incrementally or continuously, between each of the predefined regions 22 on the substrate surface 16. The controller 28 also controls the delivery of the materials 14 onto the substrate 18, recording the exact combination 13 of materials 14 that make up the coating 20 at each predefined region 22. By controlling the delivery, the controller 28 may control one or more of the material volume, the combination 13 of materials 14, the projective power, the coating speed, the spacing between the delivery mechanism 12 and the substrate 18, the masking, etc. Further, the controller 28 controls, synchronizes, combines, and records the delivery and curing of the delivered materials 14, the testing of the coating library 30, and the analysis of the test results.

The mask 34 is a material having one or more patterns of open areas and blocked areas, where the open areas allow delivery of the plurality of materials 14 onto the substrate 18 and the blocked areas prohibit the delivery. The pattern may be in any shape. The mask 34 is utilized to define the spatial variation of materials 14 in the coating library 30. In a binary masking system, for example, the mask 34 includes a plurality of patterns that are sequentially arranged to allow delivery to alternating half areas on the substrate 18. The mask 34 may be positioned anywhere in between the plurality of materials 14 and the substrate 18, including positioned directly on top of and in contact with the substrate 18, along the line of delivery of the materials 14. By increasing the spacing between the mask 34 and the substrate 18, an effect called "shadowing" is produced which may be undesirable in some instances. In shadowing, the pattern of material 14 delivered to the substrate 18 is proportional to the pattern of the mask 34, but larger, as the spacing between the mask 34 and the substrate 18 allows the delivered pattern to expand until it reaches the substrate 18. The mask 34 may be formed of a rigid or semi-rigid material, or the mask 34 may be a chemical formed on the surface 16 of the substrate 18. Preferably, the material of the mask 34 insures that the mask 34 is as flat as possible and resists bending and/or folding. Suitable examples of mask materials include: silicon, silicon oxide, and glass for rigid or relatively non-bendable materials; plastics, metals, and alloys for semi-rigid or relatively bendable materials in the form of sheets, films, or foils; and lithographic-polyacrylate ("PMMA") and other chemical materials that form negative and positive chemical masks.

The mask 34 may be secured within the system 10 and positioned relative to the delivery area 24 by the mounting device 40. The mounting device 40 may movably position the mask 34. For example, for a mask 34 in the form of an elongated semi-rigid material having a plurality of patterns, the mounting device 40 may include a tape pay-out device and a tape take-up device that are both rotatable and that support the tape, possibly in combination with rollers, relative to the delivery area 24. In another example, for a mask 34 in the form of a rigid material, the mounting device 40 may be a platform or other supporting structure connected to a motor or other actuator-type device that controls the position of the platform and mask 34 relative to the delivery area 24. This allows one pattern or a number of patterns to be utilized to mask different predefined regions 22 on the substrate 18 by movement of the mask 34. As such, the controller 28 may control the movement of the mounting device 40 to control the predefined regions 22 onto which the combination 13 of materials 14 are delivered.

The curing source 36 is a device in communication with each of the plurality of materials 14 to cause a reaction or a solvent evaporation with one or a combination 13 of the materials 14. For example, the reaction may be a polymerization, a cross-linking reaction, a small molecule reaction, an inorganic phase reaction, and other similar reactions appropriate for the delivered material(s) 14. Suitable examples of curing environments preferably include those created by a curing source 36 selected from the group consisting of ultraviolet radiation, thermal radiation, infrared radiation, microwave radiation, laser light, and humidity.

Suitable examples of a curing source 36 include a heating device in communication with the substrate 18, a radiation device in communication with the delivered or deposited materials 14, a microwave device, a plasma device, and combinations thereof. The curing source 36 may be placed in communication with each of the plurality of materials 14 such that it causes the same reaction, or degree of reaction, in each of the predefined coatings 32 in each of the predefined plurality of regions 22 or it may be placed such that it causes a different reaction, or degree of reaction, in each of the predefined coatings 32 in each of the predefined plurality of regions 22. In practice, this may be done, for example, by positioning the curing source 36 such that the plurality of materials 14 or predefined coatings 32 in each of the predefined regions 22 are exposed to heat or radiation with a linearly varying intensity across the lateral direction, or width, of the substrate 18.

The testing device 38 is a system for analyzing the performance of each of the plurality of predefined coatings 32 on the substrate 18. The testing device 38 subjects the entire coating library 30 to the same conditions in order to determine the relative performance of each one of the predefined coatings 32. The testing device 38 is in communication with the controller 28 in order to compile and analyze the test data. Suitable examples of a testing device 38 include a thickness profiler, a surface analyzer, an ultra violet ("UV") absorbance tester, a scratch resistance tester, a permeability tester, and other similar devices that test architectural, protective, decorative, and other functional features of a coating 20.

Figure 3:
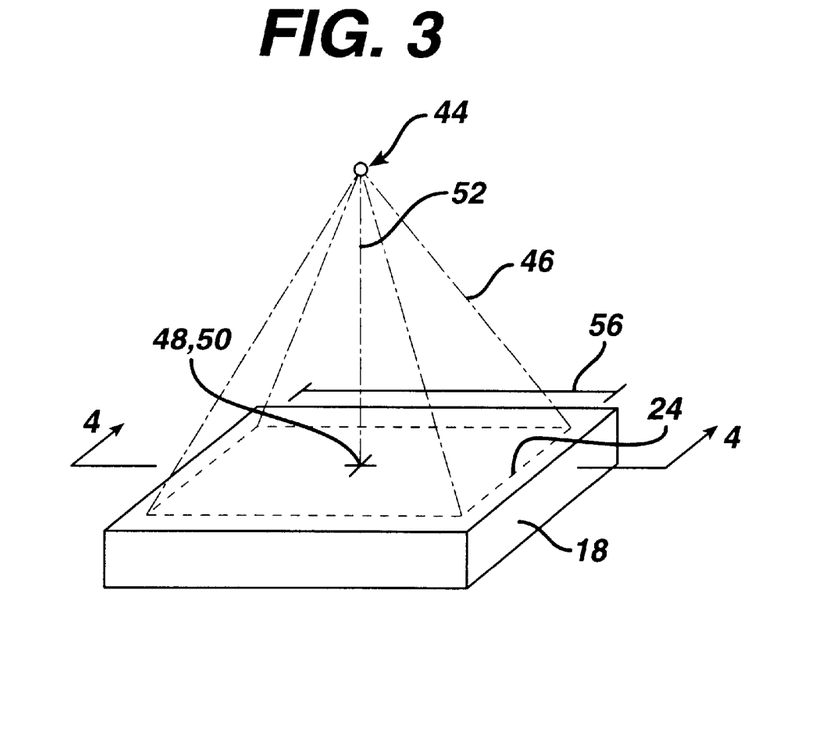
FIG. 3 is a schematic diagram of an envelope of a vaporized material being delivered from a delivery mechanism source to the surface of a substrate within a delivery area.

Referring to FIG. 3, in one embodiment of a system 10 for making an array of coated materials that form a coating library, a source of delivery 44 of the mixture 13 of materials 14 from the delivery mechanism 12 delivers a combination 13 of the plurality of materials 14 in a vaporized or atomized state within an envelope 46 that preferably encompasses the delivery area 24 in order to obtain coating coverage over the entire delivery area 24. The source 44 is the point of exit of the mixture 13 of materials 14 from the delivery mechanism 12. For example, the source 44 may be the nozzle on a spray gun. It may be desired in some cases, however, not to have coating coverage over the entire delivery area 24. For example, the envelope 46 may only encompass a portion of the delivery area 24 when a portion of the predefined regions 22 of the substrate 18 are not to be coated and a mask 34 is not being used to prevent delivery of the material 14 to those predefined regions 22. The envelope 46 may be of any convenient shape, including: conical with various cross-sections such as round, elliptical, and rectangular; semi-conical with various cross-sections; and a thin line shape. The shape of the envelope 46 may be dictated by the shape of the delivery area 24, the shape of the surface 16 of the substrate 18, the delivery mechanism 12, the desired composition of each of the plurality of predefined coatings 32, the shape and number of the predefined regions 22, the number of sources 44, the number of materials 14 being delivered to the substrate 18, and similar factors. The shape of the envelope 46 may be controlled by the shape of a nozzle on the delivery mechanism 12, by an air shroud associated with the delivery mechanism 12, or by other shape-defining structures or devices associated with the delivery mechanism 12.

Referring to FIGS. 3 and 4, in a normal focused set up 47, the source 44 has a point of focus 48 for delivering the combination 13 of materials 14 coinciding with a center point 50 of the delivery area 24. The source 44 is positioned to direct the materials 14 along a delivery angle having a centerline 52 substantially perpendicular to the surface 16 of the delivery area 24 at the center point 50. Referring to FIG. 4, the cross-sectional thickness profile 54 along one of the dimensions 56 (such as the lateral dimension of FIG. 3) of the delivery area 24 of a coating 20 delivered from the set up of FIG. 3, with the delivery angle α substantially perpendicular to the plane 58 of the delivery area 24, typically has a 2-dimensional substantially gaussian or normal distribution. The thickness profile 54 therefore has an apex 60 coinciding with the centerline 52 above the center point 50, with two equal, mirror-image tails 64 on each side of the centerline 52. Further, the source 44 is positioned at a vertical spacing 62 relative to the plane 58 of the delivery area 24. The vertical spacing 62 affects the total width 66 of the thickness profile 54 and thereby the thickness of the coating 20 at any given point along the thickness profile 54 distribution. Thus, in this case, the thickness profile 54 is centered within the dimension 56 of the delivery area 24, the thickness being largest at the apex 60 and gradually reducing in all directions from the centerline 52.

Referring to FIG. 5, in a normal off-focus set up 68, the source 44 has the point of focus 48 for delivering the combination 13 of materials 14 positioned at an offset distance 70 in the plane 58 of the delivery area 24 along the dimension 56 from the center point 50. In this case, where the centerline 52 is at a delivery angle α substantially perpendicular to the plane 58 of the delivery area 24, the offset distance 70 is substantially equivalent to the horizontal spacing 72 of the source from the normal focused set up 47 position. Also, note that the point of focus 48 for a delivery mechanism 12 may be positioned within the delivery area 24 or outside of the delivery area 24. Thus, in this case, the thickness profile 54 is offset within the dimension 56 of the delivery area 24, the thickness being largest at the offset position of the apex 60 and gradually reducing in all directions from the centerline 52.

In each of the set ups of FIGS. 4 and 5, the flatness of the thickness profile 54 within the delivery area 24 will vary depending on the vertical spacing 62 between the source 44 and the substrate 18, where the flatness will increase with increased spacing 62. In some cases, a coating library 30 having a incrementally or continuously varying thickness is desired so that the thickness variable can be analyzed with respect to the plurality of predefined coatings 32 associated with each predefined region 22 in order to focus the study on the effect of coating 20 thickness. In other cases, a coating library 30 having a constant thickness is desired so that the thickness variable can be ruled out of the analysis with respect to the plurality of predefined coatings 32 associated with each predefined region 22 in order to focus the study on the effect of coating 20 composition. In operation, a substantially constant thickness coating library 30 can be achieved by calibrating each delivery mechanism 12 in a multiple delivery mechanism 12 system 10 such that a linear thickness profile 54 is distributed across the delivery area 24. When multiple such delivery mechanisms 12 are utilized, preferably the same portion of the thickness profile 54 is positioned within the delivery area 24 for each delivery mechanism 12. A substantially constant thickness coating library 30 can also be achieved by mechanical force, as will be discussed below, when the continuously varying mixture 13 of the plurality of materials 14 is delivered as a liquid.

The vertical spacing 62, discussed above, may vary from about 0 cm to about 90 cm, more preferably from about 3 cm to about 30 cm, and most preferably from about 10 cm to about 20 cm, for the delivery of a vaporized/atomized mixture 13 of materials 14. The horizontal spacing 72, also discussed above, may vary from about 0 cm to about 60 cm, more preferably from about 3 cm to about 30 cm, and most preferably from about 10 cm to about 20 cm. The coating thickness may vary from about 1 micrometer to about 1 millimeter, and more preferably from about 5 micrometers to about 100 micrometers, and most preferably from about 5 micrometers to about 10 micrometers.

Figure 4:
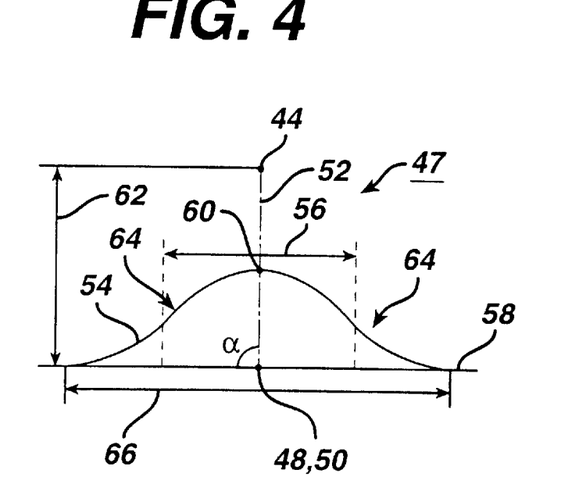
FIG. 4 is a graph of a thickness profile distributed across a dimension of a delivery area from a normal focused set up of the delivery mechanism source.
Figure 5:
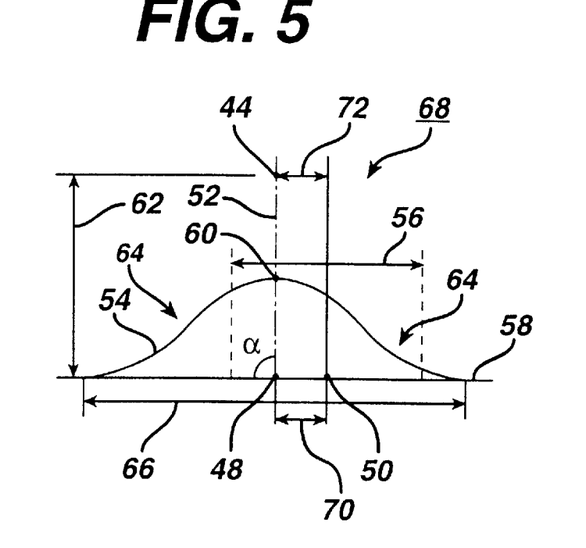
FIG. 5 is a graph of a thickness profile distributed across a dimension of a delivery area from a normal off-focus set up of the delivery mechanism source.

Thus, the embodiment described above, when incorporating an elongated substrate 18 traveling longitudinally at a constant rate, results in a coating 20 with an incrementally or continuously varying composition along the longitudinal length of the substrate 18. In other words, it results in predefined coatings 32 in laterally adjacent predefined regions 22 with like compositions, but differing predefined coating 32 compositions between longitudinally adjacent predefined regions 22 and rows of regions. With a single source 44 having a normal focused set up 47, it also results in a coating 20 with a thickness distribution 54 following a gaussian or normal distribution laterally across the surface of the substrate 18. Such a coating library 30 allows composition and thickness variables, and their interaction, with respect to coatings 20 to be studied and analyzed.

Figure 6:
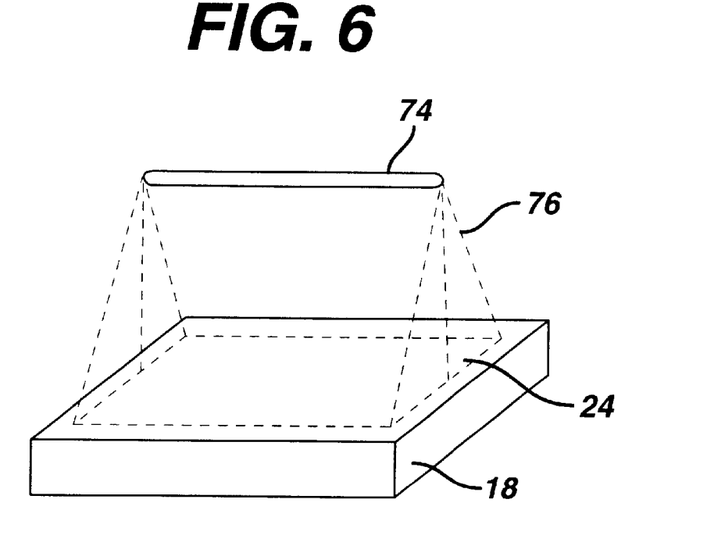
FIG. 6 is a schematic diagram of an envelope of a liquid material being delivered from a delivery mechanism source to the surface of a substrate within a delivery area.

Referring to FIG. 6, in another embodiment of a system 10 for making an array of coated materials that form a coating library, the delivery mechanism 12 may include a linear source of delivery 74 of the continuously varying mixture 13 of the plurality of materials 14. The delivery mechanism 12 delivers a mixture 13 of the materials 14 in a liquid state within an envelope 76 that preferably encompasses the delivery area 24 in order to obtain coating coverage over the entire delivery area 24. The linear source 74 is the area of exit of the combination 13 of materials 14 from the delivery mechanism 12. For example, the source 74 may be a coating applicator, having a coating head defining an elongate distribution channel with a length corresponding to a width of the substrate 18, the coating head positioned at a suitable distance adjacent to the surface 16 of the substrate 18 to dispense a uniform thickness of the combination 13 of materials 14 onto the substrate 18. The envelope 76 may be of any convenient shape, including: a wedge shape, a rectangular shape, and a thin line shape. The shape of the envelope 76 may be dictated by the shape of the delivery area 24, the shape of the surface 16 of the substrate 18, the delivery mechanism 12, the desired composition of each of the plurality of predefined coatings 32, the shape and number of the predefined regions 22, the number of sources 74, the number of materials 14 being delivered to the substrate 18, and similar factors. The shape of the envelope 76 may be controlled by the shape of a coating head on the delivery mechanism 12 or by other shape-defining structures or devices associated with the delivery mechanism 12.

Figure 7:
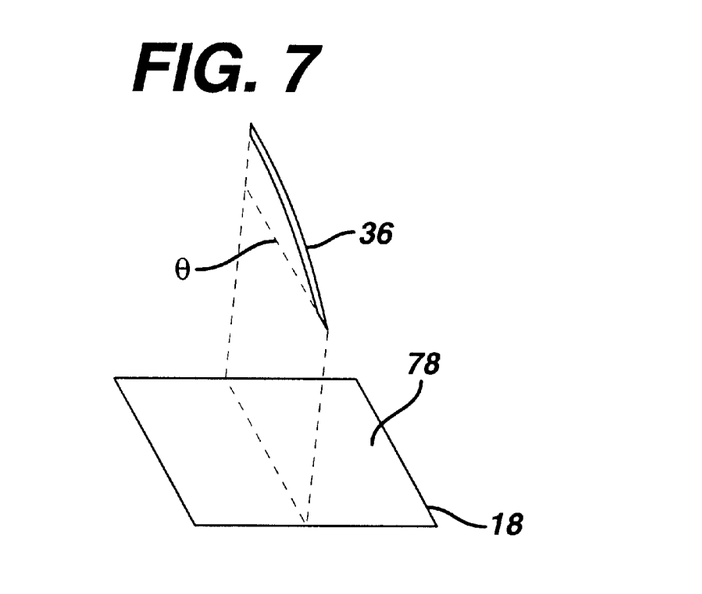
FIG. 7 is a schematic diagram of a curing source positioned above the surface of a coated substrate.

Referring to FIG. 7, a curing source 36 may be placed in communication with the combination 13 of materials 14 deposited on the substrate 18 to cause a reaction or a solvent evaporation with one or a combination of the materials. Suitable examples of a curing source 36 include a heating device in communication with the substrate 18, a radiation device in communication with the delivered or deposited mixture 13 of materials 14, a microwave device, and combinations thereof. The curing source 36 may be placed in communication with each coating 20 formed from the plurality of materials 14 such that it causes the same reaction, or degree of reaction, in each of the predefined coatings 32 in each of the predefined plurality of regions 22. For example, in FIG. 7, a curing source 36, such as a heater rod or a UV lamp bar, may be positioned above the coated substrate 18 with an angle θ to the plane 78 of the coated substrate 18 equal to 0 degrees. The curing source 36 may also be placed in communication with the coating 20 such that it causes a different reaction, or degree of reaction, in each of the predefined coatings 32 in each of the predefined plurality of regions 22. For example, in FIG. 7, a curing source 36 may be positioned above the coated substrate 18 with an angle θ to the plane 78 of the coated substrate 18 equal to 45 degrees, or any angle θ between about 0 and about 90 degrees. This set up will cause a linear variation in the curing environment to which predefined coatings 32 in predefined regions 22 along the lateral surface 16 of the coated substrate 18 are exposed. In combination with an incremental or continuous variation in composition along the longitudinal surface 16 of the coated substrate 18, composition and processing variables, and their interaction, with respect to coatings 20 can be studied and analyzed.

Figure 8:
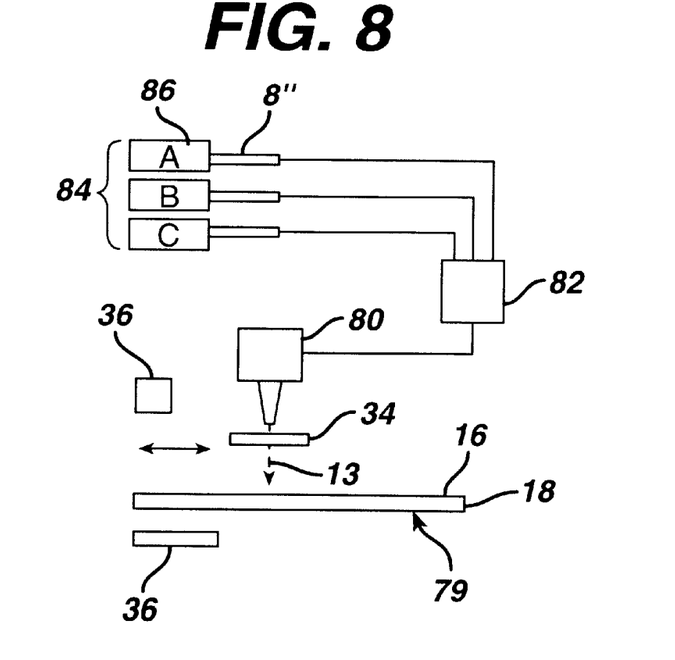
FIG. 8 is a schematic diagram of one embodiment of a system for making an array of continuously varying coated materials that form a coating library that utilizes a sprayer and mixing device.

FIG. 8 is a working example of one embodiment of a system 79 for making an array of coated materials that form a coating library. In FIG. 8, the system 79 includes a delivery mechanism such as an ultrasonic liquid sprayer 80, for example a sprayer manufactured by Sonotech, that atomizes a liquid precursor material into a fine spray by electromechanical vibration of a piezoelectric disc associated with a solution reservoir. An air shroud is used to focus and impart forward momentum to the stream of atomized liquid vapor to direct it to the traveling substrate 18 to make a coating layer. The fine mist of the liquid material could also be generated using compressed air, superheated steam, etc. The plurality of materials 14, in this case three materials, is fed to the ultrasonic sprayer 80 by an integrated in-line multichannel mixer 82. The mixer 82 preferably mechanically blends the materials 14 to form a mixture 13. The materials 14 are fed to the mixer 82 through a series of syringes 84 and motorized syringe pumps 86. By adjusting the speed/acceleration of the volume of each of the liquids fed to the mixer 82, the mixture 13 fed to the sprayer 80 will continuously vary in composition. The varying composition material is deposited on the substrate 18 creating a coating 20 with a continuously varying composition along the traveling or longitudinal direction of the substrate 18. The deposition of the coating mixture 13 on the substrate 18 can be carried out with a mask 34 to spatially separate coatings 20 of changing compositions or without a mask 34, in a "maskless" continuous phase spreading process, to get a continuous array of coatings of changing compositions, where the variation of composition is infinitesimal. The coatings 20 can be varied across the lateral surface 16 of the substrate 18 by positioning the delivery mechanism 12 at such a vertical height 62 that the thickness distribution 54 of the coating 20 follows a two-dimensional gaussian-like profile, alternatively a gradient post annealing (temperature or UV) process can be applied to the coated substrate 18, using the curing source 36 that provides variable curing across the lateral direction. The composition of the coatings may be held relatively constant across the lateral surface 16 of the substrate 18 by positioning the delivery mechanism 12 at a sufficient vertical height 62 such that the thickness distribution 54 of the coating 20 is nearly constant or uniform.

Figure 9:
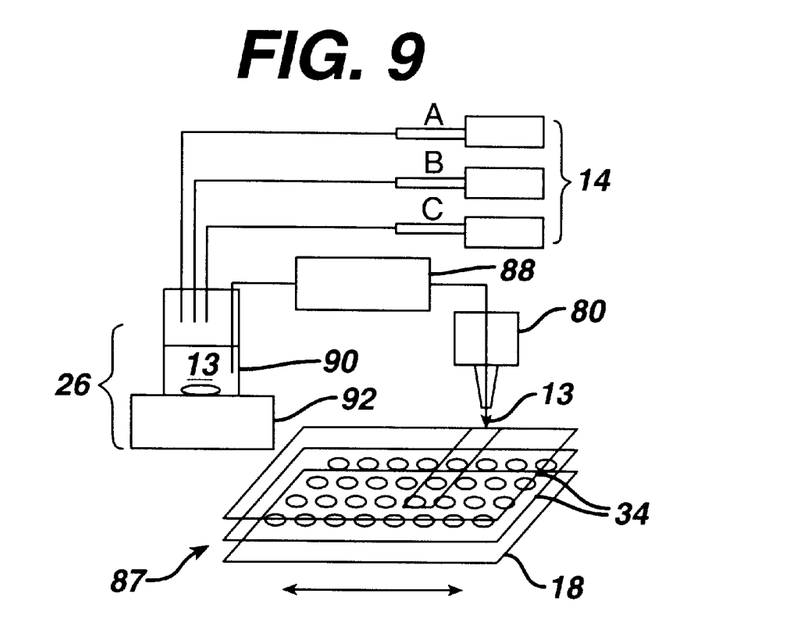
FIG. 9 is a schematic diagram of another embodiment of a system for making an array of continuously varying coated materials that form a coating library that utilizes a sprayer, a mixing device and a liquid feeding pump.

FIG. 9 is a similar working example of another embodiment of a system 87 for making an array of coated materials that form a coating library. In FIG. 9, the system 87 includes a separate mixer 26 and liquid feeding pump 88. Liquid components of the materials 14 are moved to the mixing jar 90, where they are mixed in a controlled manner using a mechanical or magnetic stirrer 92. The mixture is aspirated and fed to the sprayer 80 in a synchronized fashion during the mixing process by a liquid pump 88. Again, a traveling substrate 18 with a combination of masks 34 may be used to separate coatings 20 of varying composition and generate a coating library 30 having either gradient thicknesses or curing conditions.

Figure 10:
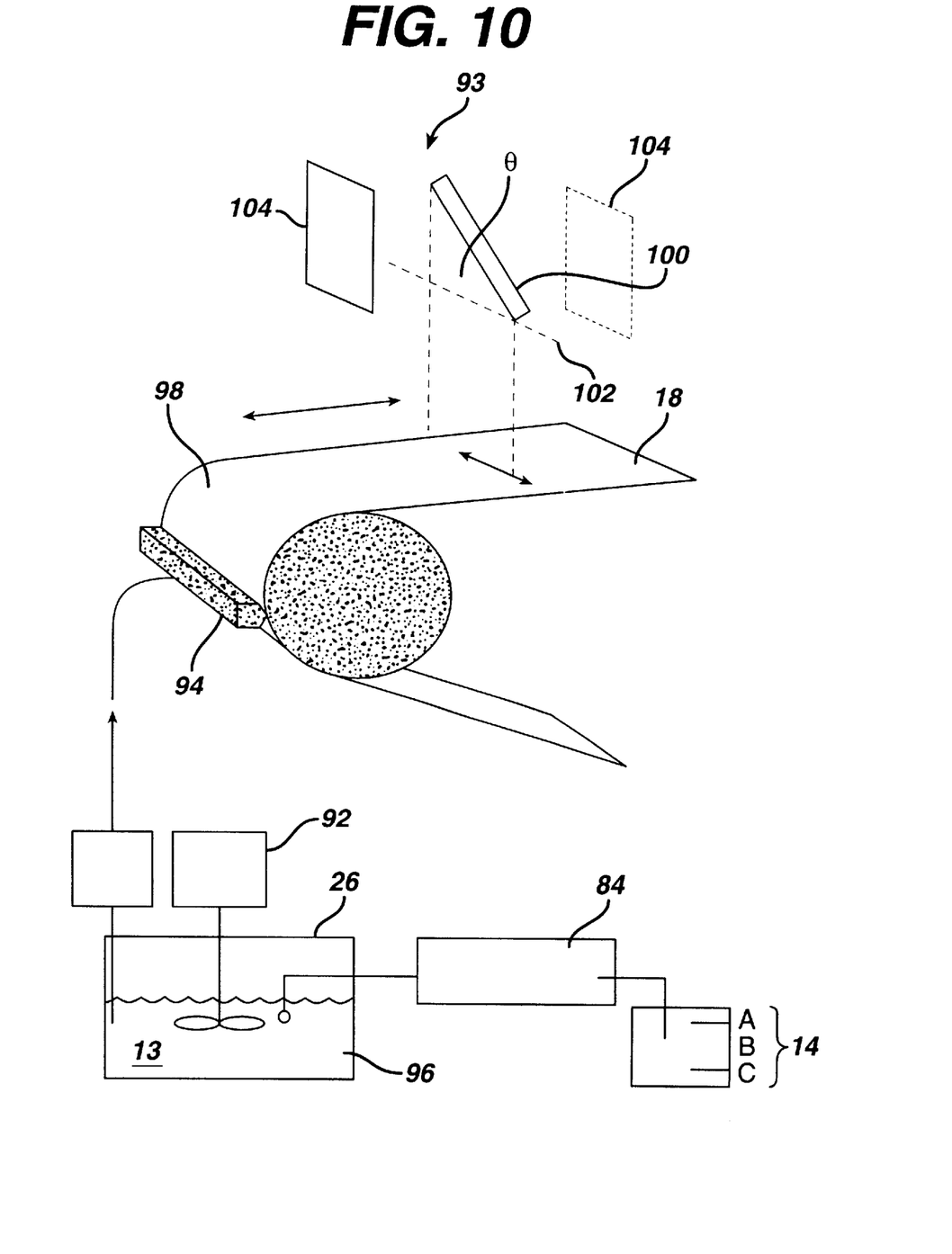
FIG. 10 is a schematic diagram of yet another embodiment of a system for making an array of continuously varying coated materials that form a coating library that utilizes a continuous coating device and a mixing device.

FIG. 10 is a further working example of yet another embodiment of a system 93 for making an array of coated materials that form a coating library. In FIG. 10, the delivery mechanism 12 is a continuous coating device 94. The continuous coating device 94 is a device that continuously feeds liquid onto a movable tape/film surface 98 with the thickness of the coating 20 mechanically controlled by force and the duration of exposure of the substrate 18 to coating material. The delivery mechanism 12 may be a die slot coating device, a wire-wound rod coating device, a roll coating device, or a small scale knife coating device. The delivery mechanism 12 is fed a constant stream of coating liquid with a continuously varying composition, which it delivers to the substrate 18. This continuously varying coating liquid is created in a mixer 26 containing a stirrer 92, such as a mechanical stirrer. Each of the materials 14 comprising the coating liquid, of which there may be a plurality, are aspirated and delivered to a coating liquid reservoir 96 by a programmable motor driven syringe 84 with fine control of the delivery rate. The mixer 26 combines or blends the materials 14 to form the coating liquid. The motor driven syringe system 84 is commercially available and can regulate material delivery speed over a large volume range. By this process, a substrate 18 is coated with a mixture 13 of a plurality of materials 14 having a continually varying composition along the direction of travel, or longitudinal direction, of the substrate 18.

This working example also utilizes a dynamic curing process with variation of thermal or UV radiation along the lateral direction of the surface of the substrate 18. A tilted heater rod or UV lamp bar 100 is placed above the coated substrate 18, with angle 0 relative to the substrate plane 102. This tilted source 100 creates a linear variation of curing field intensity along the lateral direction of the surface 16 of the substrate 18. The curing source 36 may be placed between two parallel heat/radiation shield planes 104 to direct the radiation line along the lateral direction. In commercial processing, it usually takes a few minutes to complete the curing process, depending on the intensity of the curing source 36. The curing time may be controlled by adjusting the coating/rolling speed or undertaking a doping-coating-curing process. By the process described above, a substrate 18 is coated with a mixture 13 of a plurality of materials 14 having a continually varying composition along the direction of travel, or longitudinal direction, of the substrate 18 and linearly varying curing characteristics along the lateral direction of the substrate 18. In this manner, a continuously varying coating library 30 may be manufactured.

Figure 11:
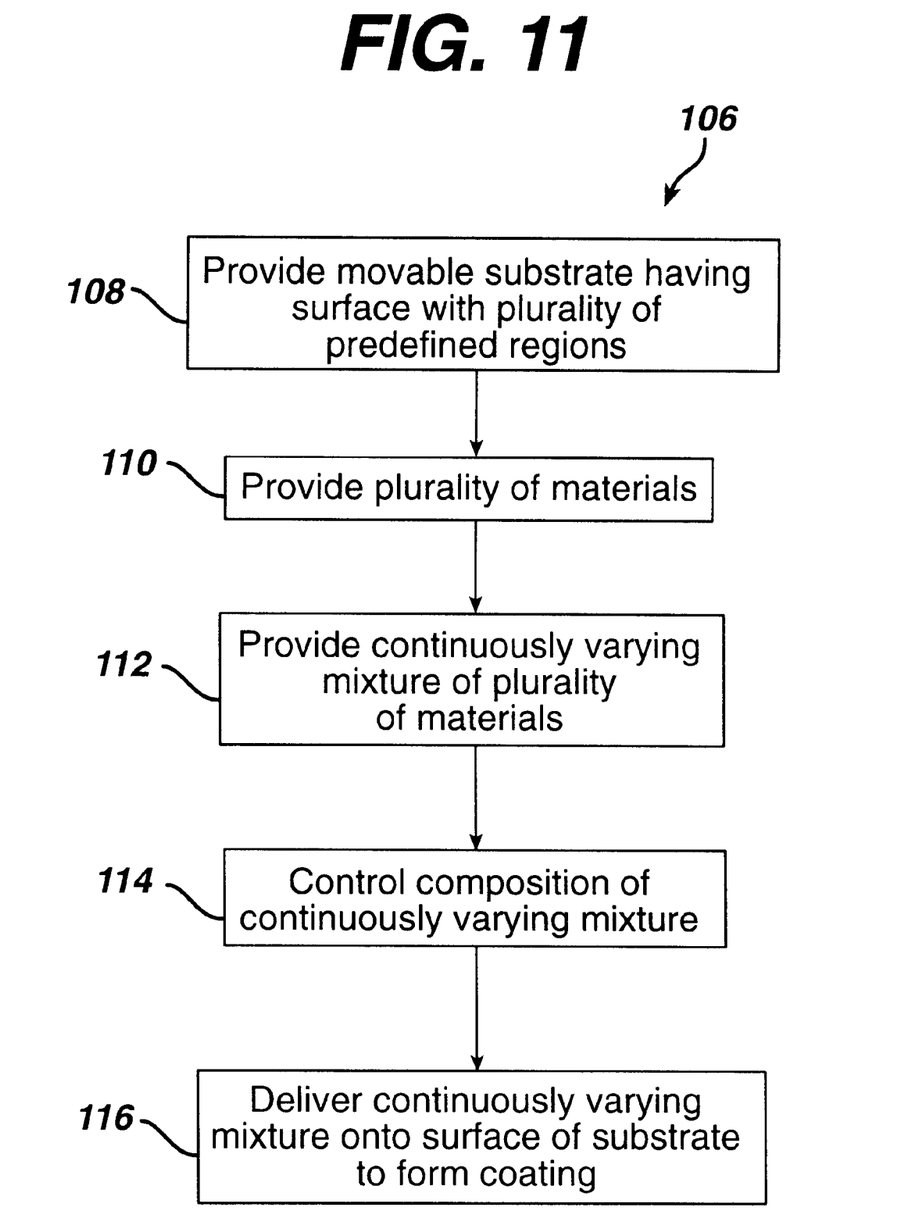
FIG. 11 is a functional block diagram of a method for making an array of coated materials that form a coating library.

FIG. 11, which summarizes the methods described in detail above, is a functional block diagram of a method 106 for making an array of coated materials that form a coating library. The method 106 includes providing a substrate 18 having a surface 16 with a plurality of predefined regions 22 (Block 108). Preferably, the substrate 18 is moving and, more preferably, the substrate 18 is moving at a substantially constant rate. The method 106 further includes providing a plurality of materials 14 for coating the substrate 18 (Block 110). The method 106 also includes providing a continuously varying mixture 13 of the plurality of materials 14 for coating the substrate 18 (Block 112). This may be accomplished using a mixer 26. The composition of the continuously varying mixture 13 of the plurality of materials 14 is controlled by a controller 28 (Block 114). Finally, the method 106 includes delivering the continuously varying mixture 13 of the plurality of materials 14 onto the surface 16 of the preferably moving substrate 18 to form a predefined coating 32 on each of the plurality of predefined regions 22 of the substrate 18 (Block 116). The continuously varying mixture 13 of the plurality of materials 14 is preferably delivered onto the surface 16 of the substrate 18 in a vaporized/atomized or liquid state and the predefined coating 32 may be a thin film coating. The method 106 may optionally include curing each of the plurality of predefined regions 22 of the coated substrate 18 using a selected one of a plurality of curing environments.

It is apparent that there has been provided in accordance with the present invention, a system and method for the fabrication of coating libraries. This invention allows for the manufacture of coating libraries having virtually infinite variations in composition, thickness of coating materials, and curing environment. While the present invention has been particularly shown and described in conjunction with preferred embodiments thereof, it will be appreciated that variations and modifications can be effected by a person of ordinary skill in the art without departing from the spirit or scope of the invention. Further, it is to be understood that the principles related to the positioning of the delivery mechanisms, the mixing of the materials to form the coatings, the thickness profiles, and the curing of the combinations of materials described herein apply in a similar manner, where applicable, to all embodiments.

What is claimed is:

1. A system for making an array of coated materials, comprising:

a substrate having a surface with a plurality of predefined regions, the substrate movable within the system;

a plurality of materials for coating the substrate;

a delivery mechanism associated with the plurality of materials, wherein the delivery mechanism is operable to deliver a continuously varying mixture of the plurality of materials onto the surface of the substrate; and a curing system operative to apply a selected one of a plurality of curing environments to each of a plurality of predefined regions of a coated substrate, wherein the curing system applies a substantially different amount of the selected curing environment to each of the plurality of predefined regions of the coated substrate, along the width of the coated substrate.

2. The system of claim 1, wherein the substrate is movable at a substantially constant rate.

3. The system of claim 1, further comprising a mixer, fluidly connected to each of the plurality of materials, to produce the continuously varying mixture of the plurality of materials.

4. The system of claim 1, further comprising a controller to control the composition of the continuously varying mixture of the plurality of materials.

5. The system of claim 1, wherein the selected one of the plurality of curing environments includes a curing source selected from the group consisting of ultraviolet radiation, thermal radiation, infrared radiation, microwave radiation, laser light, and humidity.

6. The system of claim 1, further comprising a mask having a plurality of patterns, the mask positioned adjacent to the surface of the substrate, wherein each of the plurality of patterns is positionable over the substrate, and wherein each of the plurality of patterns is unique to permit delivery of the continuously varying mixture of the plurality of materials to different combinations of the plurality of predefined regions of the substrate.

7. The system of claim 1, wherein the delivery mechanism further comprises a sprayer, having a supply inlet and a sprayer head, the supply inlet fluidly connected to the continuously varying mixture of the plurality of materials, and the sprayer head positioned adjacent to the surface of the substrate to dispense the continuously varying mixture of the plurality of materials onto the substrate.

8. The system of claim 7, wherein the continuously varying mixture of the plurality of materials is dispensed onto the substrate in a vaporized/atomized state.

9. The system of claim 1, wherein the delivery mechanism further comprises a coating applicator, the coating applicator having a supply inlet and a coating head, the supply inlet fluidly connected to the continuously varying mixture of the plurality of materials, the coating head defining an elongate distribution channel having a length corresponding to a width of the substrate, and the coating head positioned adjacent to the surface of the substrate to dispense a uniform thickness of the continuously varying mixture of the plurality of materials onto the substrate.

10. The system of claim 9, wherein the continuously varying mixture of the plurality of materials is dispensed onto the substrate in a liquid state.

11. The system of claim 1, further comprising a movable holding device having a securing mechanism operative to hold and support the substrate during coating and curing.

12. The system of claim 11, wherein the holding device is movable at a substantially constant rate.

13. The system of claim 1, wherein each of the plurality of materials comprises a material selected from/the group consisting of polymeric materials, oligomeric materials, small molecules, thermoplastic polymers, and thermosetting polymers.

14. A system for making an array of coated materials, comprising:

a substrate having a surface with a plurality of predefined regions, the substrate movable within the system;

a plurality of materials for coating the substrate;

a mixer, fluidly connected to each of the plurality of materials, to produce a continuously varying liquid mixture of the plurality of materials;

a controller to control the composition of the continuously varying mixture of the plurality of materials;

a delivery mechanism associated with the continuously varying mixture of the plurality of materials, wherein the delivery mechanism is operable to deliver the continuously varying mixture of the plurality of materials onto the surface of the substrate; and a curing system operative to apply a selected one of a plurality of curing environments to each of a plurality of predefined regions of a coated substrate, wherein the curing system applies a substantially different amount of the selected curing environment to each of the plurality of predefined regions of the coated substrate, along the width of the coated substrate.

15. The system of claim 14, wherein the substrate is movable at a substantially constant rate.

16. The system of claim 14, wherein the selected one of the plurality of curing environments includes a curing source selected from the group consisting of ultraviolet radiation, thermal radiation, infrared radiation, microwave radiation, laser light, and humidity.

17. The system of claim 14, further comprising a mask having a plurality of patterns, the mask positioned adjacent to the surface of the substrate, wherein each of the plurality of patterns is positionable over the substrate, and wherein each of the plurality of patterns is unique to permit delivery of the continuously varying mixture of the plurality of materials to different combinations of the plurality of predefined regions of the substrate.

18. The system of claim 14, wherein the delivery mechanism further comprises a sprayer, having a supply inlet and a sprayer head, the supply inlet fluidly connected to the continuously varying mixture of the plurality of materials, and the sprayer head positioned adjacent to the surface of the substrate to dispense the continuously varying mixture of the plurality of materials onto the substrate.

19. The system of claim 18, wherein the continuously varying mixture of the plurality of materials is dispensed onto the substrate in a vaporized/atomized state.

20. The system of claim 14, wherein the delivery mechanism further comprises a coating applicator, the coating applicator having a supply inlet and a coating head, the supply inlet fluidly connected to the continuously varying mixture of the plurality of materials, the coating head defining an elongate distribution channel having a length corresponding to a width of the substrate, and the coating head positioned adjacent to the surface of the substrate to dispense a uniform thickness of the continuously varying mixture of the plurality of materials onto the substrate.

21. The system of claim 20, wherein the continuously varying mixture of the plurality of materials is dispensed onto the substrate in a liquid state.

22. The system of claim 14, further comprising a movable holding device having a securing mechanism operative to hold and support the substrate during coating and curing.

23. The system of claim 22, wherein the holding device is movable at a substantially constant rate.

24. The system of claim 14, wherein each of the plurality of materials comprises a material selected from the group consisting of polymeric materials, oligomeric materials, small molecules, thermoplastic polymers, and thermosetting polymers.

* * * * *

UNITED STATES PATENT AND TRADEMARK OFFICE
CERTIFICATE OF CORRECTION

PATENT NO.    : 6,482,264 B1
DATED         : November 19, 2002
INVENTOR(S)   : Xiao-Dong Sun It is certified that error appears in the above-identified patent and that said Letters Patent is hereby corrected as shown below:

Column 1,
Before BACKGROUND OF THE INVENTION, insert the following paragraph:
-- This invention was made with government support under Contract No. 70NANB9H3038, awarded by NIST. The government may have certain rights to the invention. --

Signed and Sealed this

Eleventh Day of November, 2003

JAMES E. ROGAN
*Director of the United States Patent and Trademark Office*